(12) United States Patent
Shimada

(10) Patent No.: US 6,272,046 B1
(45) Date of Patent: Aug. 7, 2001

(54) INDIVIDUAL SOURCE LINE TO DECREASE COLUMN LEAKAGE

(75) Inventor: Hisayuki Shimada, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/562,748

(22) Filed: May 2, 2000

(51) Int. Cl.[7] .................................................. G11C 16/04
(52) U.S. Cl. .............................. 365/185.17; 365/185.18; 365/185.33
(58) Field of Search ...................... 365/185.06, 185.17, 365/185.18, 185.33, 185.05

(56) References Cited

U.S. PATENT DOCUMENTS

| | | | |
|---|---|---|---|
| 5,920,509 | * 7/1999 | Hirano et al. | 365/185.24 |
| 5,949,718 | * 9/1999 | Randolph et al. | 365/185.33 |
| 6,046,932 | * 4/2000 | Bill et al. | 365/185.02 |
| 6,067,250 | * 5/2000 | Ravazzi et al. | 365/185.09 |

* cited by examiner

Primary Examiner—Son Mai
(74) Attorney, Agent, or Firm—H. Donald Nelson

(57) ABSTRACT

A flash memory device and a method to read the flash memory device to decrease leakage current during read. The flash memory device has a source line control circuit connected to the sources of memory cells in a row and during read the source line control circuit connects the sources of the memory cells in a row to ground.

5 Claims, 4 Drawing Sheets read operation

|  | WL | BL | SL |
|---|---|---|---|
| selected | 4 - 5 V | ~ 1 V | GND |
| unselected | open | open | GND |

| read operation | WL | BL | SL |
|---|---|---|---|
| Selected | 4-5V | ~1V | GND |
| Unselected | open | low/open | open/rel.high |

INDIVIDUAL SOURCE LINE TO DECREASE COLUMN LEAKAGE

BACKGROUND OF THE INVENTION

1. Field of the Invention

This invention relates generally to the art of microelectronic integrated circuits. More specifically, this invention relates to flash Electrically Erasable Programmable Read Only Memory (EEPROM) devices. Even more specifically, this invention relates to an architecture of flash Electrically Erasable Programmable Read Only Memory (EEPROM) devices and a method to read the flash Electrically Erasable Programmable Read Only Memory (EEPROM) devices to reduce column leakage during read.

2. Discussion of the Related Art

A class of non-volatile memory devices known as "flash" EEPROM (Electrically Erasable Programmable Read Only Memory) devices combines the advantages of EPROM density with the electrical erasability of an EEPROM. One feature that distinguishes flash EEPROM memory cells from standard EEPROM memory cells is that unlike standard EEPROM memory cells, flash EEPROM memory cells do not contain a select transistor on a one-for-one basis with each floating gate memory cell. A select transistor is a transistor that allows the selection of an individual memory cell within the memory device and is used to selectively erase a specific memory cell. Because flash EEPROMs do not have a select transistor for each floating gate transistor, flash EEPROM memory cells cannot be individually erased and therefore must be erased in bulk, either by erasing the entire chip or by erasing paged groups or banks of cells. Elimination of the select transistor allows for smaller cell size and gives the flash EEPROM an advantage in terms of manufacturing yield (in terms of memory capacity) over comparably sized standard EEPROMs.

Typically, a plurality of flash EEPROM cells is formed on a semiconductor substrate, which is also known as a silicon wafer. FIG. 1A illustrates a single conventional flash EEPROM memory cell having a double-diffused source region. As shown in FIG. 1, flash memory cell 100 is formed on a p-type substrate 110 and includes an n type double-diffused source region 102 and an n+ drain region 104. The drain region 104 and the source region 102 are spaced apart from each other forming a channel $L_{CHANNEL}$ 122. A source electrode 114 and a drain electrode 112 are connected to the source region 102 and the drain region 104, respectively. A substrate electrode 105 is connected to the substrate 110.

The double-diffused source region 102 is formed of a lightly doped n region 128 (phosphorous doped) and a more heavily doped but shallower n+ region 130 (arsenic doped) embedded within the deep n region 128. The phosphorus doping within the n region 128 reduces the horizontal electric field between the source region 102 and the substrate 110.

The floating gate 106 is disposed a short distance above the source region 102, the drain region 104 and the channel $L_{CHANNEL}$ 122, and over a dielectric layer 118, which is also known as a tunnel oxide region. Above the floating gate 106 and disposed over the dielectric layer 116 is a control gate 108. The dielectric layer 116 is typically formed of an oxide/nitride/oxide layer known in the semiconductor manufacturing art as an ONO layer. A control gate electrode 120 is attached to control gate 108. The dimension $L_{GATE}$ 132 represents the gate length for the gates contained in flash memory cell 100.

In a conventional method of operation, the programming of a flash EEPROM memory cell is achieved by inducing "hot electron" injection from a section of the channel 122 near the drain 104 into the floating gate 106. The injected electrons cause the floating gate 106 to carry a negative charge. Grounding the source region 102, biasing the control gate 108 to a relatively high positive voltage and biasing the drain region 104 to a moderate positive voltage induce the hot electrons.

For example, to program the flash memory cell 100 the source electrode 114 is connected to ground, the drain electrode 112 is connected to a relatively high voltage (typically +4 volts to +9 volts) and the control gate electrode 120 is connected to a relatively high voltage level (typically +8 volts to +12 volts). Electrons are accelerated from source region 102 to drain region 104 via the channel 122 and the "hot electrons" are generated near the drain region 104. Some of the hot electrons are injected through he relatively thin gate dielectric layer 118 and become trapped in the floating gate 106 thereby giving floating gate 106 a negative potential.

After sufficient negative charge accumulates on floating gate 106 the negative potential of floating gate 106 raises the threshold voltage of the stacked gate transistor and inhibits current flow through the channel 122 during a subsequent "read" mode. The magnitude of the read current is used to determine whether a memory cell has been programmed.

Conversely, to erase a flash memory device electrons are typically driven out of the floating gate 106 by biasing the control gate 108 to a large negative voltage and biasing the source region 102 to a low positive voltage in order to produce a sufficiently large vertical electric field in the tunnel oxide. The large vertical field in the tunnel oxide produces Fowler-Nordheim (F-N) tunneling of electrons stored in the floating gate 106 through the tunnel oxide into the source region 102. The charge removed from the floating gate 106 produces a threshold voltage shift.

For example, during erasure a relatively low positive voltage (typically from +0.5 volts to +5 volts) is applied to source electrode 114 and a relatively large negative voltage (typically from −7 volts to −13 volts) is applied to control gate electrode 120. The voltage of the substrate electrode 105 is grounded and the drain electrode 112 is allowed to float. The vertical electric filed established between the control gate 108 and the source region 102 induces electrons previously stored in floating gate 106 to pass through dielectric layer 118 and into source region 102 by way of Fowler-Nordheim tunneling.

In order to produce a sufficient electric field in the tunnel oxide, it is typically necessary to bias the control gate 108 to a large enough negative voltage such that the floating gate 106 reaches a voltage of approximately −5.5 volts. A typical potential difference $V_{SF}$ between the source region 102 and floating gate 106 is on the order of 10 volts and accordingly, when the source voltage $V_s$ is made less positive the control gate voltage $V_{CG}$ should be made more negative. Once the source to floating voltage $V_{SF}$ is selected, the remaining factors are preferably constrained according to the equation:

$$V_{FG} = \alpha_{CG}(V_{CG} - \Delta V_T) + \alpha_S V_S + \alpha_B V_B$$

where:
- $V_{FG}$ = the floating gate voltage;
- $V_{CG}$ = the control gate voltage;
- $V_S$ = the source voltage;
- $V_B$ = the substrate or p-well bias;
- $\Delta V_T$ = the threshold voltage difference arising from negative charge added to the floating gate as measured from the control gate;

$\alpha_{CG}$=the capacitive coupling coefficient from the control gate to the floating gate;

$\alpha_S$=the capacitive coupling coefficient between the source and the floating gate;

$\alpha_B$=the capacitive coupling coefficient between the substrate or p-well and the floating gate.

The cell is read by applying typically 4 to 5 volts to the control gate, approximately 1 volt or less to the bitline to which the drain is connected, grounding the source, and sensing the bitline current. If the cell is programmed and the threshold voltage is relatively high ($\approx$4 volts), the bitline current will be zero or at least relatively low. If the cell is not programmed or erased, the threshold voltage will be relatively low ($\approx$2 volts), the control gate voltage will enhance the channel, and the bitline current will be relatively high.

To have high enough read current, the voltage at the gate is required to be 4 to 5 volts. Because the source is grounded (0 volts), this relatively large potential difference exists across the tunnel oxide in the vicinity of the source region and causes a stress field across the tunnel oxide in the vicinity of the source region during the duration of the read pulse. Because all of the sources have a common terminal, this stress field is applied across all the bits on the selected wordline. Due to oxide integrity weakness from bit-to-bit, some bits will gain charge and disturb the state of the bits. Blank "1" cells could be programmed and turn to a "0" causing a failure of the flash device after many read cycles. The field across the tunnel oxide is highest close to the source junction. The "thin" tunnel oxide at the source side experiences most of the degradation during cycling, becoming weak thereby allowing conduction through it at lower applied electric fields. In addition, because the bitline to which the cell being read has a voltage applied to it all of the cells connected to that bitline will have a potential difference between the drain and the source because all of the sources are connected to a common terminal. As discussed above, if the threshold voltage of an unselected cell or a number of unselected cells has decreased, the leakage current may mask the expected read current and a faulty read will occur. This will result in failure of the entire memory device.

Therefore, what is needed is a method of reading the memory device to minimize the number of times the relatively large potential difference is applied across each individual cell during read and to decrease the leakage current in the bitlines during read.

SUMMARY OF THE INVENTION

According to the present invention, the foregoing and other objects and advantages are obtained by a memory device and a method of reading the memory device that reduces the leakage current in the bitline of the cell being read.

In accordance with one aspect of the invention, the memory device has a source line control circuit connected to a source line that is connected to all the sources of memory cells in a row. During read only the source line connected to the source of the selected memory cell to be read is attached to ground. The source lines connected to the sources of unselected cells are left open.

In accordance with another aspect of the invention, the source line control circuit is controlled by the voltage applied to the wordline that is attached to the control gate of the selected cell to be read.

The described method thus provides a memory device and a method of reading the memory device that reduces the leakage current in the bitlines to which the selected cell to be read is attached.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to specific embodiments of the present invention that illustrate the best mode presently contemplated by the inventors for practicing the invention.

Figure 1:
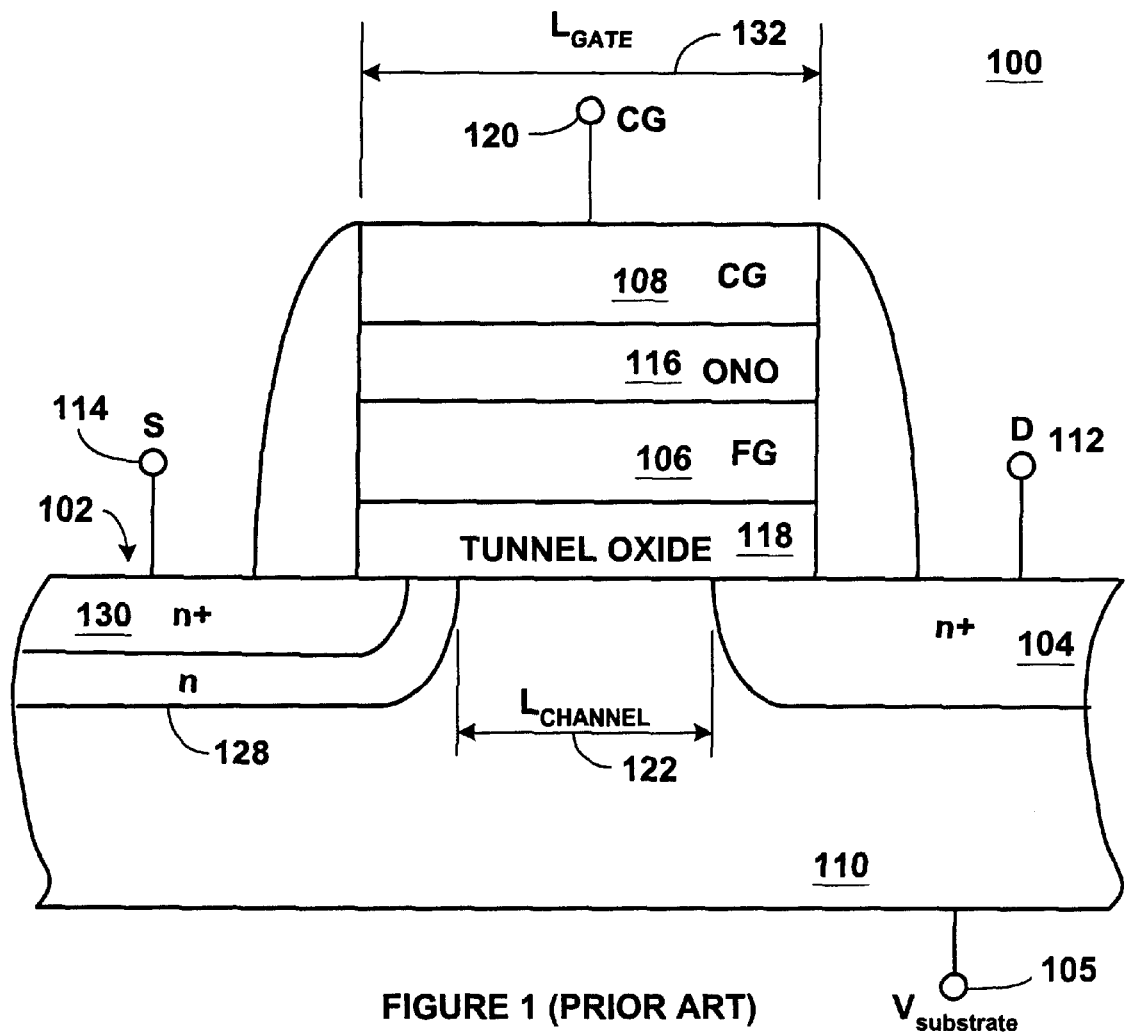
FIG. 1 shows the architecture of a typical flash memory cell with a double diffused source region.
Figures 2A, 2B:
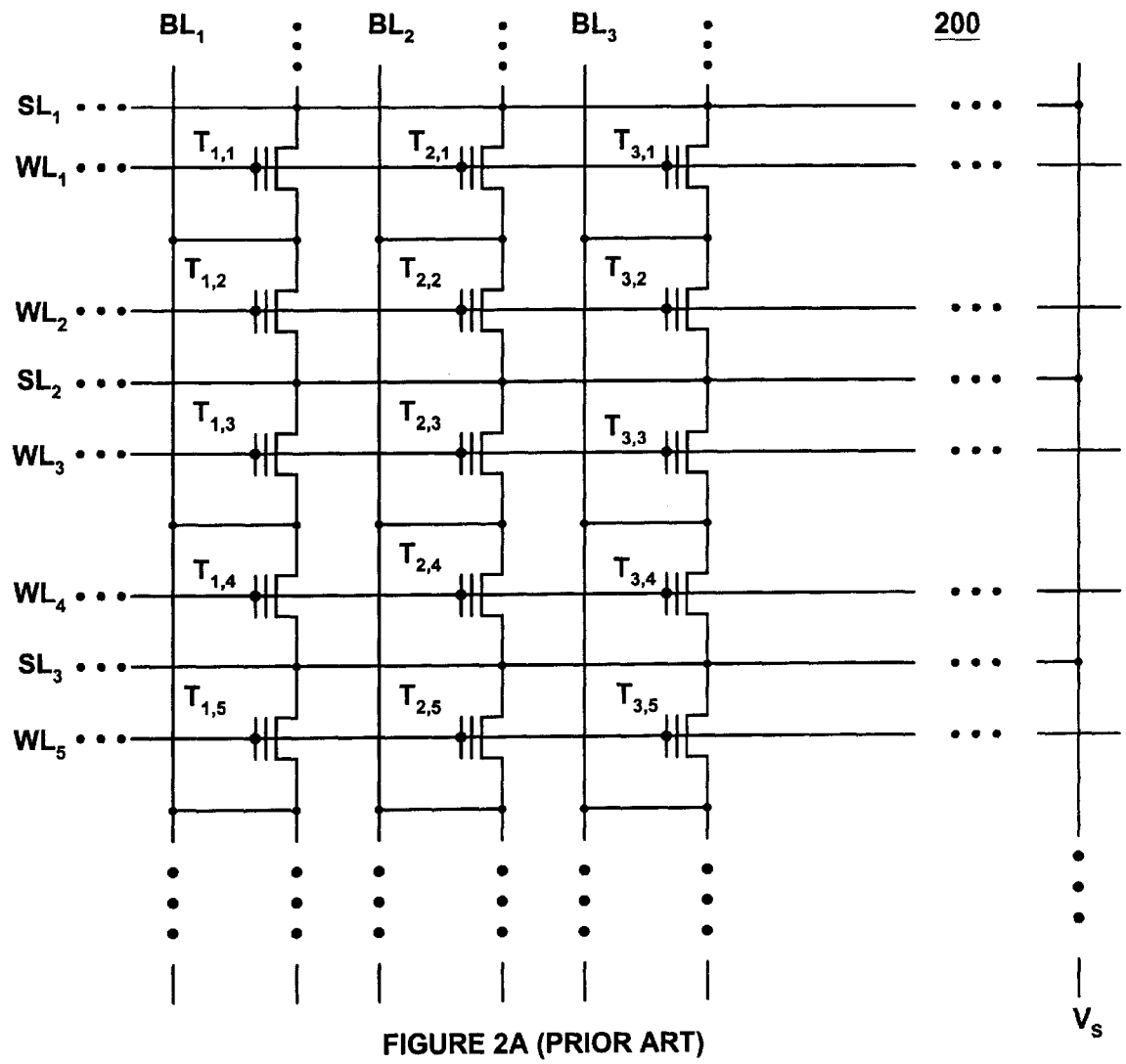
FIG. 2A shows the architecture of a portion of a typical flash memory device.
FIG. 2B shows the voltages applied to the selected and unselected wordlines, bitlines and sources during a read operation of the flash memory device shown in FIG. 2A.

FIG. 2A shows the basic configuration of a portion 200 of a NOR type flash Electrically Erasable Programmable Read-Only Memory (EEPROM) of a typical flash memory device. The portion 200 of the flash memory device comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$, and the wordlines are designated as $WL_0$ to $WL_m$. Appropriate voltages are applied to the bitlines by a bitline driver (not shown), whereas appropriate voltages are applied to the wordlines by a wordline driver (not shown).

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 2A are designated using the notation $T_{n,m}$, where m is the row (wordline) and n is the column (bitline). The control gates of the cells are connected to respective wordlines and the drains of the cells are connected to respective bitlines as illustrated. The sources of all of the cells are connected to the common terminal at $V_s$.

FIG. 2B lists the voltages applied to the selected and unselected wordlines and bitlines and shows the voltage applied to the common source terminal. In accordance with the values listed in FIG. 2B, if transistor $T_{2,2}$ is to be read, a voltage of approximately 1 volt is applied to $BL_2$ and because all of the sources are connected to ground at terminal $V_S$ there will be a potential difference (drain to source) $V_{DS}$ across all of the transistors connected to $BL_2$ and each of these transistors could contribute to the leakage current sensed on $BL_2$ that could mask the proper read current. In addition, because a voltage of approximately 4 to 5 volts is applied to $WL_2$ and all of the sources are connected to ground at terminal $V_S$, all of the cells connected to $WL_2$ will have a potential difference (gate to source) $V_{GS}$ of approximately 4 to 5 volts. As discussed above, this potential difference can cause stress of the tunnel oxide in the region of the source. This stress will decrease the reliability of the memory device.

Figure 2C:
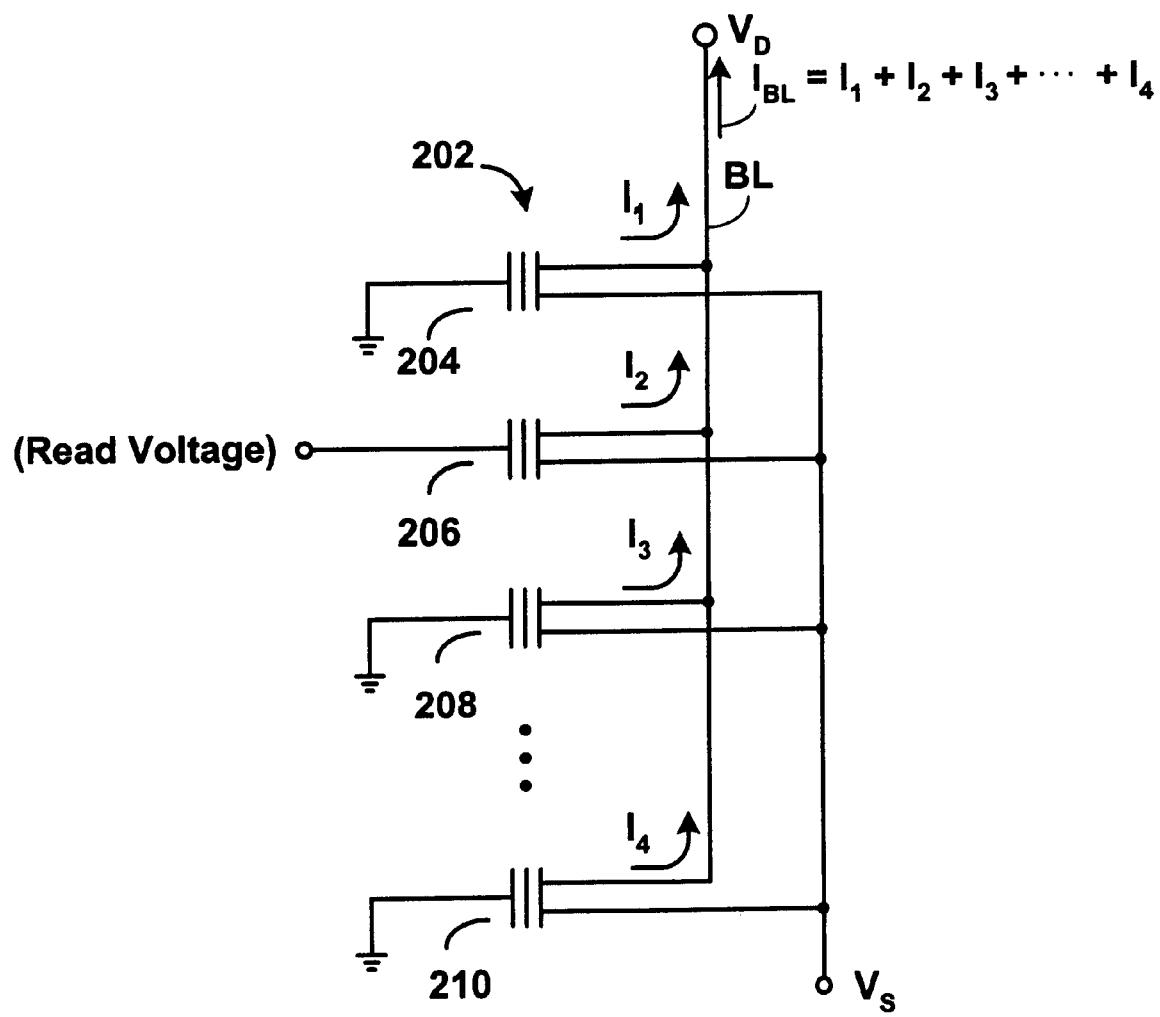
FIG. 2C is a simplified electrical schematic diagram of a column of flash EEPROM cells illustrating the leakage currents from overerased or low threshold voltage memory cells.

The undesirable effect of leakage current is illustrated in FIG. 2C, which is a simplified electrical schematic diagram of a column 202 of flash EEPROM cells, 204, 206, 208 and 210. The sources of the column 202 of transistors are all connected to a source supply voltage $V_s$. A read voltage is applied to the control gate of the transistor 206, which turns it on. A current $I_2$ flows through the transistor 206 from ground through its source, channel (not shown) and drain. Ideally, the bitline current $I_{BL}$ is equal to 12. However, if one or more of the unselected transistors, for example transistors 204, 208 or 210 as illustrated in FIG. 2C, are overerased or slightly overerased, their threshold voltages will be very low, zero or even negative, and background leakage currents $I_1, I_3$, and $I_4$ could flow through the transistors 202, 208 and 210, respectively. The bitline current $I_{BL}$ would then be equal to the sum of 12 and the background leakage currents $I_1, I_3$ and $I_4$. In a typical flash EEPROM, the drains of a large number of memory transistor cells, for example 512 transistor cells are connected to each bitline. If a substantial number of cells on the bitline are drawing background leakage current, the total leakage current on the bitline can exceed the cell read current. This makes it impossible to read the state of any cell on the bitline and therefore renders the memory inoperative.

Figures 3A, 3B:
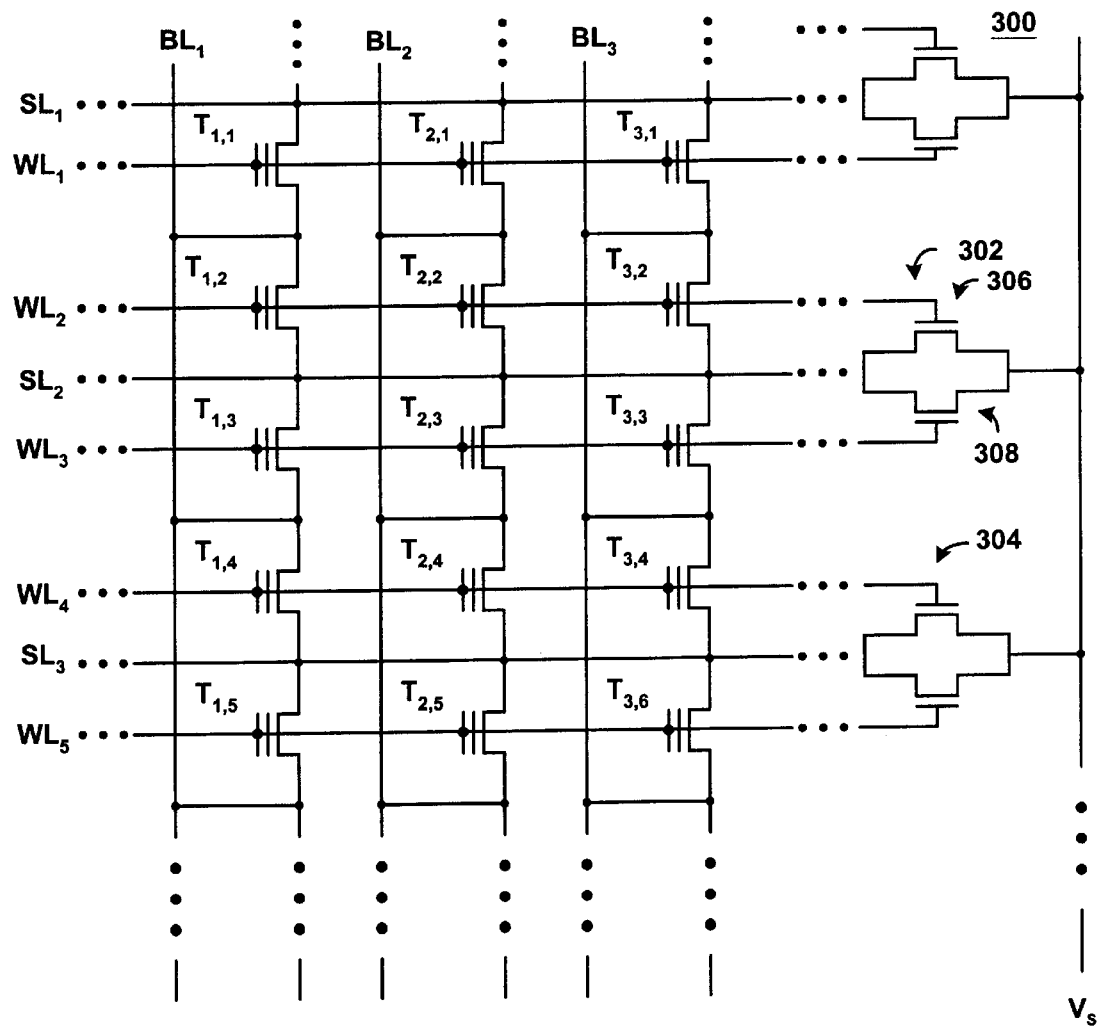
FIG. 3A shows a the architecture of a portion of a flash memory device in accordance with the[4]present invention.
FIG. 3B shows the voltages applied to the selected and unselected wordlines, bitlines and sources during a read operation of the flash memory device shown in FIG. 3A.

FIG. 3A shows the basic configuration of a portion 300 of a NOR type flash Electrically Erasable Programmable Read-Only Memory (EEPROM) of a flash memory device in accordance with the present invention. The portion 300 of the flash memory device comprises a plurality of core or memory cells, which are arranged in a rectangular matrix of rows and columns. Each row is associated with a wordline (WL), whereas each column is associated with a bitline (BL).

Similar to the prior art device shown in FIG. 2A, assuming there are n columns and m rows, the bitlines are designated as $BL_0$ to $BL_n$, and the wordlines are designated as $WL_0$ to $WL_m$. A bitline driver (not shown) applies appropriate voltages to the bitlines and a wordline driver (not shown) applies appropriate voltages to the wordlines.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 3A are designated using the notation $T_{n,m}$, where m is the row (wordline) and n is the column (bitline). The control gates of the cells are connected to respective wordlines and the drains of the cells are connected to respective bitlines as illustrated. Each wordline is connected to a respective source line control circuit. For example, wordlines $WL_2$ and $WL_3$ are connected to source line control circuit 302 and wordlines $WL_4$ and $WL_5$ are connected to source line control circuit 304. Each source line control circuit connects a respective source line to a source terminal $V_S$. As an example, source line control circuit 302 controls the connection of source line $SL_2$ to terminal $V_S$. The source line control circuit 302 includes a first transistor 306 that is turned on by wordline $WL_2$ and thereby connects source line $SL_2$ to terminal $V_S$. The source line control circuit 302 also includes a second transistor 308 that is turned on by wordline $WL_3$ and thereby connects source line $SL_2$ to terminal $V_S$. In the present configuration, the wordlines control the state of the associated source line control circuit.

FIG. 3B lists the voltages applied to the selected and unselected wordlines and shows the voltage applied to the source of the selected cell. In accordance with the values listed in FIG. 3B, if transistor $T_{2,2}$ is to be read, a voltage of approximately 1 volt is applied to $BL_2$ and a voltage of approximately 4–5 volts is applied to $WL_2$ that causes transistor 306 to turn on and connects source line $SL_2$ to $V_S$, which is set to ground. The unselected source lines are set to either open or a high enough voltage so that there is no potential difference VDs across unselected cells on $BL_2$. The absence of the potential difference $V_{DS}$ prevents leakage current from the unselected cells.

In summary, the present invention overcomes the limitations of the prior art and reduces the amount of leakage current present in the sensed bitline current during a read operation.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of reading a flash Electrically-Erasable Programmable Read-Only Memory (EEPROM) device composed of multiple memory cells each having a source, drain, control gate, wherein the memory cells are organized in rows and columns with each memory cell in a row connected to a wordline, each memory cell in a column connected to a bitline and each source of a memory cell in a row connected to a source line; the method comprising:

(a) applying a voltage of approximately 4–5 volts to the wordline attached to the control gate of a cell selected to be read;

(b) applying a voltage of approximately 1 volt to the bitline attached to the drain of the cell selected to be read;

(c) attaching the source line attached to the source of the cell selected to be read to ground;

(d) opening wordlines attached to control gates of cells not selected to be read;

(e) opening bitlines attached to drains of cells not selected to be read; and (f) opening sourceline attached to sources of cells not selected to be read.

2. The method of claim 1 wherein step (c) is accomplished by (g) causing a source line control circuit attached to the source of the cell selected to be read to be connected to $V_S$ that is at ground.

3. The method of claim 2 wherein step (d) is accomplished by (h) applying the voltage applied to the wordline attached to the control gate of the cell being read to the source line control circuit.

4. The method of claim 3 further comprising reading the selected cell by (i) sensing the current in the bitline attached to the memory cell selected to be read.

5. A method of reading a flash Electrically-Erasable Programmable Read-Only Memory (EEPROM) device composed of multiple memory cells each having a source, drain, control gate, wherein the memory cells are organized in rows and columns with each memory cell in a row connected to a wordline, each memory cell in a column connected to a bitline and each source of a memory cell in a row connected to a source line; the method comprising:

(a) applying a voltage of approximately 4–5 volts to the wordline attached to the control gate of a cell selected to be read;

(b) applying a voltage of approximately 1 volt to the bitline attached to the drain of the cell selected to be read;

(c) attaching the source line attached to the source of the cell selected to be read to ground;

(d) opening wordlines attached to control gates of cells not selected to be read;

(e) applying a voltage to bitlines attached to drains of cells not selected to be read and applying a voltage to sourcelines attached to sources of cells not selected to be read such that a drain to source voltage $V_{DS}$ is substantially equal to zero.

* * * * *